United States Patent [19]

Teng et al.

[11] Patent Number: 4,656,732

[45] Date of Patent: Apr. 14, 1987

[54] INTEGRATED CIRCUIT FABRICATION PROCESS

[75] Inventors: Clarence W. Teng, Plano; Roger A. Haken, Richardson, both of Tex.

[73] Assignee: Texas Instruments Incorporated, Dallas, Tex.

[21] Appl. No.: 654,998

[22] Filed: Sep. 26, 1984

[51] Int. Cl.[4] ......................................... H01L 21/283
[52] U.S. Cl. .................................... 29/591; 29/571; 29/577 C; 29/590; 357/68; 156/643; 427/93
[58] Field of Search ................... 29/571, 577 C, 591, 29/590; 357/68; 156/643, 626, 627; 427/93, 94, 95

[56] References Cited

U.S. PATENT DOCUMENTS

| | | | |
|---|---|---|---|
| 4,045,594 | 8/1977 | Maddocks | 29/591 |
| 4,488,162 | 12/1984 | Jambotkar | 357/68 |
| 4,489,481 | 12/1984 | Jones | 29/591 |
| 4,507,853 | 4/1985 | McDavid | 29/577 C |

OTHER PUBLICATIONS

Murarka, "Refractory Silicides for Integrated Circuits", *J. Vac. Sci. Tech.*, 17(4), Jul./Aug. 1980.
Ghondi, *VLSI Fabrication Principles*, John Wiley & Sons, New York, 1983.

*Primary Examiner*—Brian E. Hearn
*Assistant Examiner*—John T. Callahan
*Attorney, Agent, or Firm*—Robert Groover; Jim Comfort; Melvin Sharp

[57] ABSTRACT

Integrated circuits wherein the width of contacts is narrowed by a sidewall oxide, so that the metal layer can be patterned to minimum geometry everywhere, and does not have to be widened where it runs over a contact.

8 Claims, 13 Drawing Figures

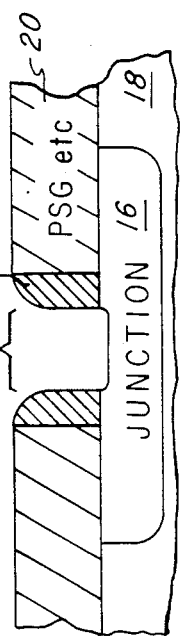
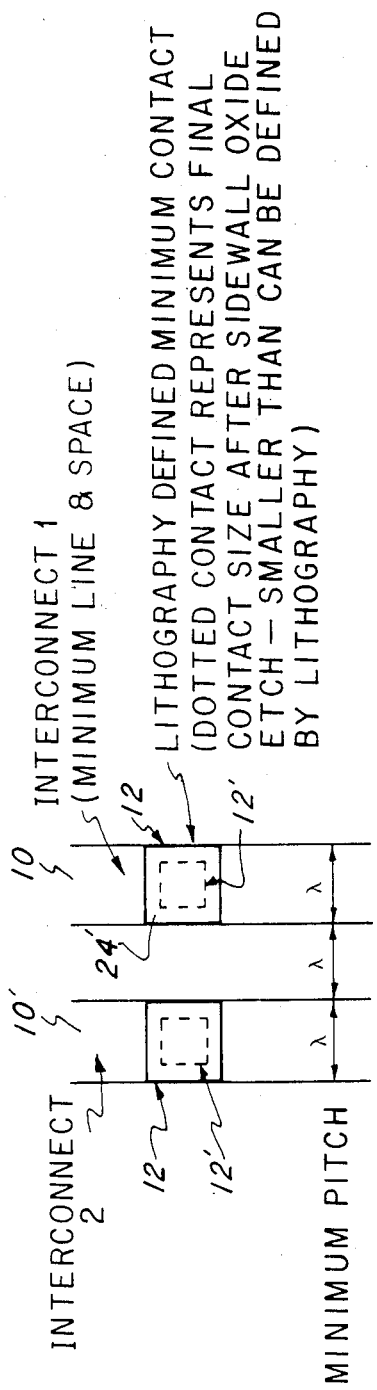

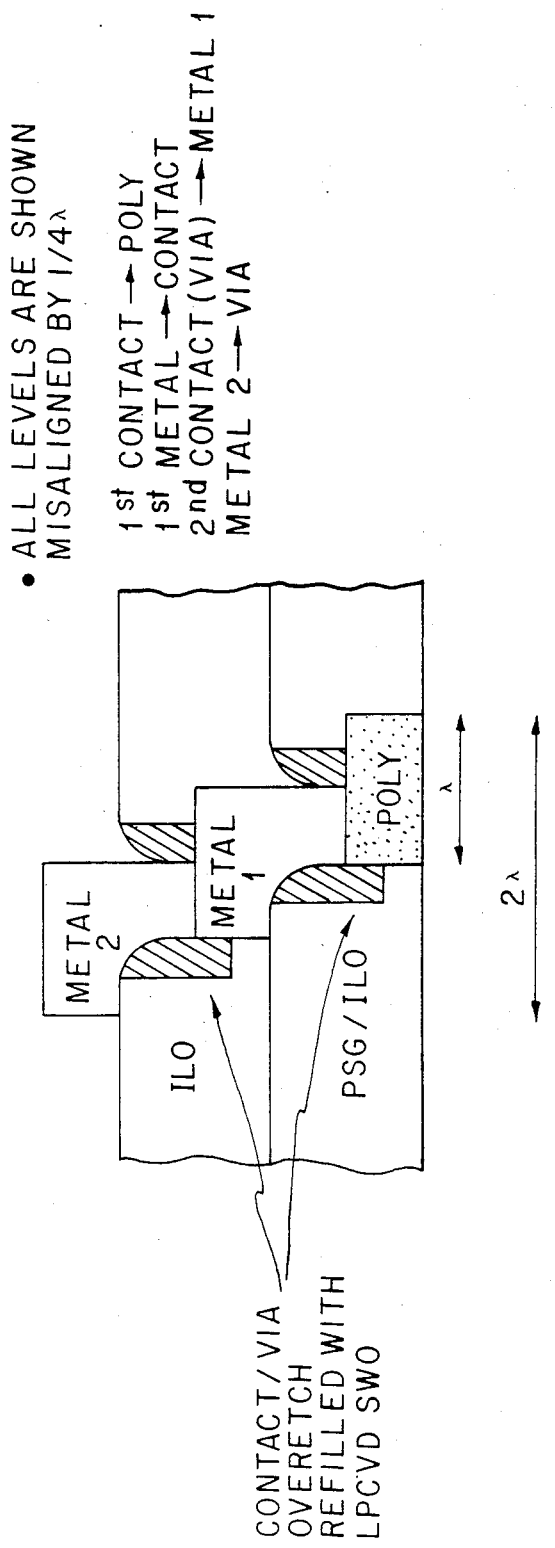

INTEGRATED CIRCUIT FABRICATION PROCESS

BACKGROUND AND SUMMARY OF THE INVENTION

The present invention relates to integrated circuits.

As integrated circuits are scaled to smaller and smaller geometry, tremendous economic pressure is placed on circuit layout techniques. That is, any modification which will permit the same circuit to be laid out smaller, for essentially the same geometries and processing conditions, will improve yield in two ways: First, if the area for each chip which is susceptible to random defects is reduced, the percentage of chips which are knocked out by random defects will presumably be reduced. Second, as area is reduced, more chips can be built on a single wafer, i.e. more chips can be built for essentially the same cost.

However, in the prior art, one factor which has continually degraded layout density is the geometry of the metallization layers, and particularly the geometry of metallization layers where contacts are necessary. FIG. 1 shows an example of the difficulties of the prior art in this respect. FIG. 1 shows a sample of a miniumum geometry layout with two metal lines 10 running parallel to each other. Each metal line 10 has width equal to the minimum geometry lambda ("lambda" is a term used by circuit designers to refer to the minimum geometry available to them in a particular process, which might be 5 microns for one set of processing conditions or $1\frac{1}{2}$ microns for another set. The particular value of lambda is relatively unimportant to the circuit designer, since he can simply state all dimensions in terms of lambda, and let the processing engineers worry about improving lambda as their process control improves.) However, FIG. 1b shows an example of what happens to the minimum geometry layout of FIG. 1a if adjacent contacts 12 are necessary. Such adjacent contacts are very frequently necessary in memory cell or microprocessor or random logic layouts. The contact holes 12 are patterned by a different patterning step (a different mask level) than the patterning of the metal lines 10, so it is possible that the locations of the contact holes 12 may be misaligned with the respect of the metal lines 10. Where the minimum geometry is lambda, the registration tolerance, i.e., the maximum amount of misalignment to be expected between structures which are, like these patterned in two different patterning steps, might typically be one quarter of lambda. Thus, if, using prior art techniques, we attempted to make both of the contacts 12 and the metal lines 10 overlying them of minimum geometry, the metal lines 10 would frequently be misaligned somewhat with the contacts 12. This can have a number of undesirable effects. For example, the contact resistance will be uncontrolled, since the actual electrical area of each contact will be variable. Moreover, where contact is being made to moat or polysilicon levels, the overetch necessary to clear filaments of metal will attack these sensitive regions. Perhaps the most important disadvantage arises in via fabrication, e.g. where contact is being made from second metal to first metal or from first metal to poly: in this case, if the contact is misaligned to the edge of the lower conductor which is supposed to be contacted, the contact etch will excavate a void in the insulator adjacent to the second conductor. In this case, some of the metal subsequently deposited will be used to fill up this void, so that the metal overlying this void will be excessively thin. This provides inferior metal step coverage at these locations, so that the device may initially fail due to a open circuit, or may fail prematurely in use due to electromigration. To avoid this, in the prior art, it is necessary to widen the metal lines 10 by one registration tolerance where they cross over the contacts 12. This is the conventional layout technique shown in FIG. 1b. Note that, where no contacts are necessary, both the metal line width and the space between lines are minimum dimension lambda, so that the total pitch (i.e. the center-to-center spacing of metal lines) is merely twice lambda. Where contacts are necessary, as in FIG. 1b, the space in between the lines 10 is still minimum geometry lambda, but, at one point along their travel, the metal lines are both $1\frac{1}{2}$ times lambda wide, so that the center to center spacing of these parallel metal lines must be $2\frac{1}{2}$ times lambda. Thus, the layout density at the metal level has been very substantially degraded.

These problems apply not only to metal to moat contacts, but also to metal to poly and metal to metal contacts (commonly referred to "vias"). Heretofore, it has been desirable that the edge of a metal line should not overlap the contact which that metal line is supposed to make contact to. Again, if the metal lines must be widened to avoid missing the contact locations; then the density of the second metal layer will be degraded, and the density of the first metal layer is also likely to be degraded.

The foregoing has described the shortcomings of the prior art on the assumption that contacts can be patterned using the minimum feature size lambda. Of course, if the minimum geometry for the contacts is larger than the minimum geometry for the metal layer, which is quite likely, then the degradation imposed by the prior art as discussed above is even worse.

Thus, the foregoing problem is particularly acute in gate array and semicustom logic layouts. That is, in conventional layout techniques, a great deal of hand-optimization will typically be used to avoid having contacts lined up side by side, to mitigate the adverse affects of these contacts on metal geometry. However, where a layout is designed to be adapted, in accordance with the customer's requirements, by selectively defining the contact and second metal stages for each small quantity of circuits, the problem is even worse. This is, in designing circuits for such use it is necessary not merely to minimize adjacent location of contacts, but to minimize the collocation of possible contact locations.

Thus, if a fabrication technology could avert this necessary for minimum geometry metal lines to be widened in the neighborhood of contacts, layout problems would obviously be greatly simplified.

Thus it is an object of the present invention to provide an integrated circuit fabrication technology wherein minimum geometry metal lines need not be widened, where they intersect contact locations, to width greater than that of the contact itself.

It is a further object of the present invention to provide integrated circuit structures wherein the pitch of the metal levels is not greater than twice the minimum geometry.

It is a further object of the present invention to provide an integrated circuit fabrication process wherein metal lines crossing contact locations need not be patterned to a width any greater than the patterned width of the contact location.

To achieve these and other objects, the present invention teaches use of a sidewall in the patterned contact locations to narrow the contact by an amount equal to or greater than the registration tolerance. That is, after the contact holes have been patterned and etched, they are narrowed using a filament sidewall, so that misalignment will not cause the contacts to slop over the edge of the patterned layer which they are supposed to hit. This means that, for patterning purposes, the patterned width of the contact can be made exactly equal to the minimum geometry, and the metal level which must align with that contact can also be patterned exactly equal to the minimum geometry, without any danger of its missing the contact hole location.

According to the present invention there is provided:

A process for fabricating integrated circuits, comprising the steps of:

providing a substrate having semiconductor active device regions near the surface thereof; providing an insulating layer above predetermined portions of said active device regions;

defining a first metal interconnect layer which interconnects predetermined portions of said active device regions to configure a predetermined circuit function;

providing an interlevel dielectric above said first metal interconnect layer, and anisotropically etching said interlevel dielectric to expose said first metal interconnect layer at predetermined via locations;

conformally depositing an additional layer of insulating material, and anisotropically etching said additional layer of insulating material to remove it from exposed flat surfaces, whereby said exposed via locations are narrowed at the periphery thereof by remaining portions of said additional layer of insulating material; and depositing and patterning an additional layer of conductive material, to interconnect said via areas in a predetermined pattern.

BRIEF DESCRIPTION OF THE DRAWINGS

The present invention will be described with reference to the accompanying drawings, wherein:

FIG. 2a-2c show successive steps in the fabrication process of the present invention, applied to form moat contacts;

FIG. 3 shows the layout of a device according to the present invention, wherein the metal pitch remains at exactly twice the minimum geometry even though adjacent parallel metal lines must both cross over adjacent contact locations;

FIG. 6c shows how harm from such misalignment is averted using the present invention, in the particular case of a nested contact structure;

FIG. 8 shows an embodiment of the present invention wherein a thin nitride layer is deposited over the interlevel dielectric in which the contact holes will be cut before the contact etch is performed, so that thinning of the interlevel dielectric is avoided.

DESCRIPTION OF THE PREFERRED EMEBODIMENTS

The present invention will be described with reference to only a few principal preferred embodiments, but it will be recognized by those skilled in the art that the present invention may be widely modified and varied, and may be applied to a wide variety of processes. The scope of the present invention is therefore expressly not limited except as set forth in the accompanying claims.

Figure 2A:
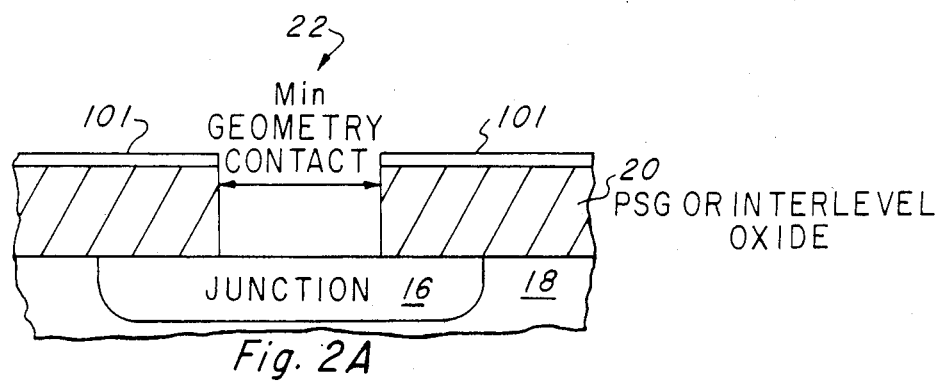

The present invention is most advantageous in the fabrication of vias, but it is also applicable to fabrication of moat contacts. FIG. 2a shows a sample application of the present invention to metal to moat contacts. That is, in this sample embodiment, a diffused region 16, which would typically be the extension of an n+ source/drain region within asubstrate 18, will be contacted by metal. The diffusion 16, together with accompanying gate oxide and polysilicon gate structures, would typically be covered by a phosphosilicate glass or other interlevel oxide layer 20. Holes are then anisotropically etched in this interlevel dielectric at locations 22. In the presently preferred embodiment, the particular contact area 22 shown is etched to a minimum geometry, i.e. has width lambda, where lambda is defined within the context of the particular process as described above. In this presently preferred embodiment, the width of the contact 22 shown will be one micron. The thickness of the interlevel oxide 20 is also shown as being about one micron adjacent to this particular contact area 22, but it will be recognized by those skilled in the art that the thickness of the interlevel dielectric 20 will vary locally, and, for example, the thickness of the interlevel oxide 20 which must be cut through when making a metal to polysilicon contact will be less than the thickness of interlevel oxide 20 which must be cut through when making a metal to moat contact.

Figure 2B:
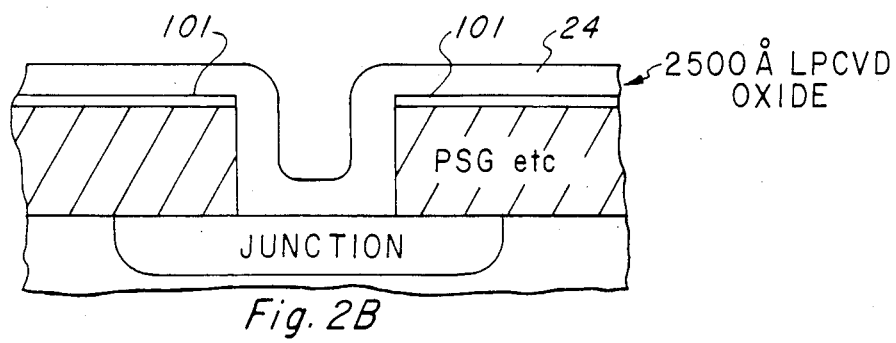

After the contact areas 22 have been cut, a conformal dielectric is deposited. In the presently preferred embodiment, this layer 24 consists essentially of a conformally deposited, e.g. low pressure chemical deposited, oxide. As presently preferred, this is deposited as a TEOS oxide, i.e. deposited from tetraethylorthosilane gas phase. This layer 24 is deposited to a thickness greater than the registration tolerance between the contact level and the succeeding metal level. In the presently preferred embodiment, where the misalignment tolerance is 0.2 microns, layer 24 is deposited to 2500 Angstroms thickness. This results in the structure as shown in FIG. 2b.

Alternatively, the oxide 24 could be deposited by low-pressure chemical vapor deposition using other gas mixtures well known in the art, or could be deposited as a plasma oxide. That is, where deposition is assisted by a plasma, deposition can occur at temperatures as low as about 300° c., as compared to the higher temperatures (about 700° C.) preferable when LPCVD using TEOS is done.

Next, the LPCVD oxide 24 is etched back to leave sidewall oxide filaments 24 prime. The width of these filaments at the base will be nearly equal to the original thickness of the conformal layer, and therefore will still be greater than the misalignment tolerance between the contact and metal layers. As is well known to those skilled in the art, to achieve this, the dielectric layer 24 should be etched to slightly more than 100%, i.e. etched for a long enough time to clear it from all flat surfaces, and also etched for just a little bit longer, to make sure that the oxide 24 is cleared from the bottom of the contact hole 22. This results in the oxide filaments 24 prime. These filaments now surround the periphery of the contact holes 22, so that the contact hole 22 has been shrunk on every side by one alignment tolerance, or a little bit more.

Figures 1A, 1B:
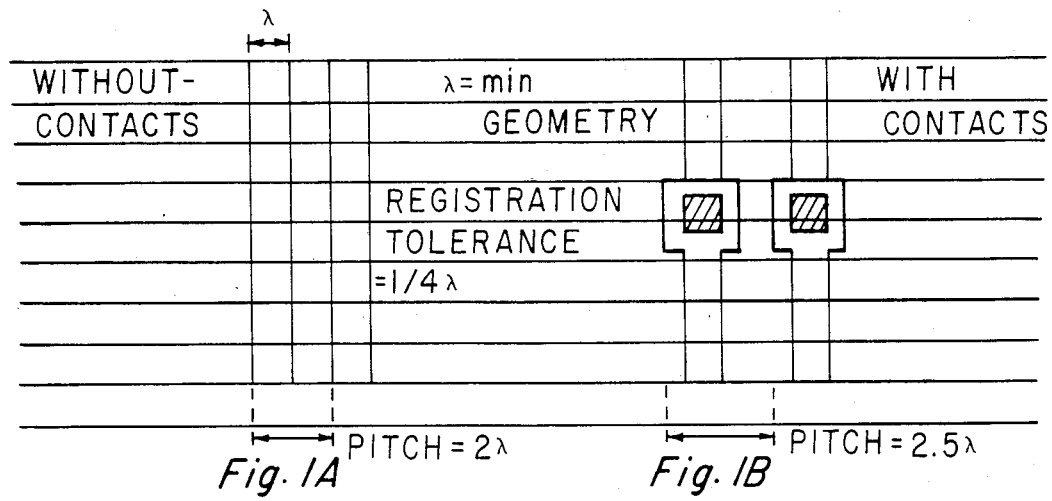
FIGS. 1a and 1b show prior art structures, wherein the minimum pitch which can be used for simple straight parallel metal lines (shown in FIG. 1a) cannot be used where those metal lines run over adjacent contact locations, as shown in FIG. 1b.

This is clearly seen in the plan view of FIG. 3. In this plan view, metal lines 10 prime run over patterned contact areas 12, but, as opposed to the prior art embodiment of FIG. 1b, the width of lines 10 prime remains at minimum geometry, even when they cross the contact areas 12. This is possible because the addition of the sidewall oxides 24 prime means that the actual electrical contact area is not the same as the patterned contact area 12, but consists merely of a reduced contact area 12 prime, shown by the dotted lines in FIG. 3. This reduced contact area 12 prime will certainly not go beyond the boundaries of the metal lines 10 prime, for the reasons discussed above. Note that these reduced contact areas 12 prime are actually sublithographic, that is, they are smaller than could be directly patterned.

In the presently preferred embodiment, the conformal oxide 24 is over etched substantially, e.g. 100% over etched (i.e. etched for the twice the amount of time which it takes to clear this oxide off of a flat surface), to ensure that the bottom of the contact area 22 is cleared. This over etch will typically also reduce the thickness of the dielectric 20 somewhat, and may also mean that the silicon at the bottom of the contact hole is also etched away slightly (since no silicon etch has infinite selectivity) during the over etch stage. However, both of these effects can easily be compensated for, and are minor.

To avoid thinning of the interlevel dielectric, and also provide better control of the width of the sidewall oxides, the present invention can be configured in an alternative embodiment as follows. A thin layer of silicon nitride, e.g. 300 Angstroms thick, is deposited atop the interlevel dielectric before the photoresist to pattern the contact holes is spun on. The contact holes are cut using an oxide etch which will cut nitride also. The protective layer 24 which will provide the sidewall filaments 24 prime is now deposited and etched to leave filaments. However, in this embodiment, the nitride layer 101 which was deposited on the interlevel dielectric 20 will provide a tremendous endpoint signal when the layer 24 is cleared from flat surfaces. Thus, it is not necessary to perform as much overetching of the layer 24, since the degree of overetching can be controlled with reference to the endpoint signal provided when the etching plasma contacts the thin nitride layer 101 over the flat surface of the interlevel dielectric 20.

An important result of the present invention is that the actual contact area will be reduced, and thus the series resistance of the contact will be increased. For example if a one micron square contact is give sidewalls of 0.2 microns one very side, the contact area will be reduced from about one square micron to about one third as much. Assuming that contact resistivity stays the same, the series resistance through this contact will be increased accordingly.

In the presently preferred embodiments, this is not of great concern, since the contacts still will not provide a major contribution to the series resistance of the integrated circuit formed. In comparison to the series resistance imposed by polysilicon or moat connections, contact resistance will typically be small. That is, the present invention is most preferably practiced in embodiments where the specific contact resistance is low enough that the diminution of contact area is not electrically disastrous. For example, where the present invention is applied to contacts to polysilicon, the present invention preferably uses processes, such as silicided polysilicon, which will yield a low specific contact resistance, for example 0.04 microohm-centimeter-squared. In this case a one micron square contact will have a resistance of 4 ohms, which is insignificant, and use of a 0.2 micron square sidewall will result in a contact resistance which is still only about 2 ohms. However, if the specific contact resistance were instead relatively large, e.g. 1 microohm-centimeter-squared, tripling the contact resistance from 100 ohms to 300 ohms might be most undesirable.

As seen in FIG. 2c, the sidewall oxides 24 prime are rounded at the top, but still the contact sidewall profiles are much steeper than would normally be achieved by a process, such as resist erosion or reflow of the interlevel dielectric 20, which aims at achieving sloped contact sidewalls. Thus, it is preferable in connection with the present invention to use a stud contact process or a conformal metal deposition. Such processes have widely been described in the literature.

Thus, the present invention has the cardinal advantage that the metal pitch is not degraded by the contact layout used.

A secondary advantage of the present invention is that the moat pitch is also now freed from the constraints which might be imposed by contact layout. That is, not only is it desirable that the metal lines not miss the contact holes, it is also highly desirable that the contact holes not miss the moat areas which they are supposed to contact. For example, in FIGS. 1a and 1b, if the lines indicating metal level 10 were taken instead to indicate a moat level 10 prime, the contact spacing shown would also degrade moat pitch. Although moat pitch is likely to be drastically constrained by contact layout in this fashion then metal pitch is, still this is an additional advantage of the invention which provides designers with additional latitude.

Figure 4:
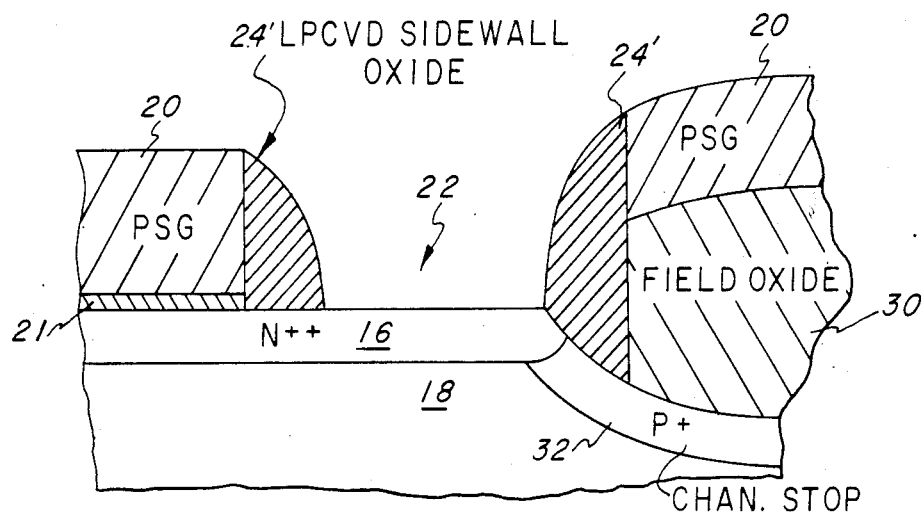
FIG. 4 shows a further aspect of one particular class of embodiments wherein the present invention is applied to fabrication of moat contacts.

In one particular embodiment of the invention, as shown in FIG. 4, alignment tolerance need not be left between the contact mask and the edge of the field oxide. Thus, in the embodiment shown in FIG. 4, where a contact area 22 prime has been cut through an interlevel dielectric 20 and a thin pad oxide 21 to contact a diffusion 16 in a substrate 18, it will be noted that the etch of the contact hole 22 prime as originly cut has also cut off the birdsbeak (i.e. the tapering extremity) of the field oxide 30. This would normally be diastrous, since this would mean that the metal which would be deposited in the contact hole 22 prime would make contact to the p+ channel stop diffusion 32, inducing a short circuit. However, using the present invention, the sidewalls 24 prime have refilled the area where the birdsbeak was eroded, and therefore this short circuit path (from the metal to be deposited in the contact hole 22 prime, through the p+ channel sto 32 to the substrate 18) is avoided. This provides another advantage of the present invention.

Figure 7A:
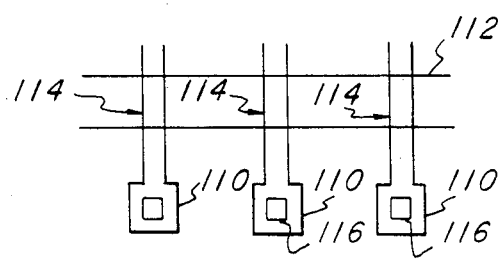
FIG. 7A shows a sample prior art structure, wherein the pitch between active areas is degraded by the pitch required for contacts to the polysilicon leve.
Figure 7B:
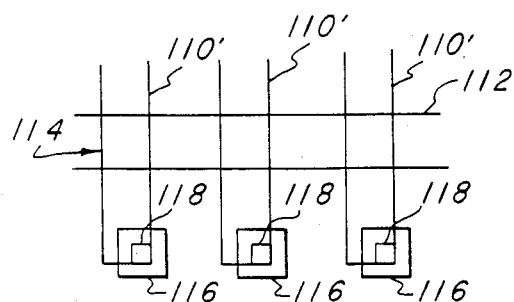
FIG. 7B shows how this degradation of geometry is avoided by the present invention.

Another advantage of the invention, and a very important one, is its liberating effect on polysilicon pitch. That is, in many circuit designs, as shown in FIG. 7A, the pitch between active device areas (i.e. areas 114 where a poly level 110 crosses a moat 112) will be degraded by the required spacing of the metal-to-poly contacts (vias) 116, due to the necessity of broadening the poly layer 110 in the vicinity of the vias 116 as discussed above. However, using the present invention more compact layouts as shown in FIG. 7B can be attained in these circumstances. That is, in this embodiment of the invention the patterned contact area 116 is reduced by sidewalls to provide an effective contact area 118. This means that, even when the patterned contact area 116 is made so small as to miss the polysilicon layer 110 prime (which is not widened at the locations of vias 116), the use of sidewalls to compensate for the alignment tolerances means that the actual resulting effective contact 118 does not miss the narrowed polysilicon lines 110 prime. Thus the pitch between active areas 114 can be left at minimum geometry.

Figure 5:
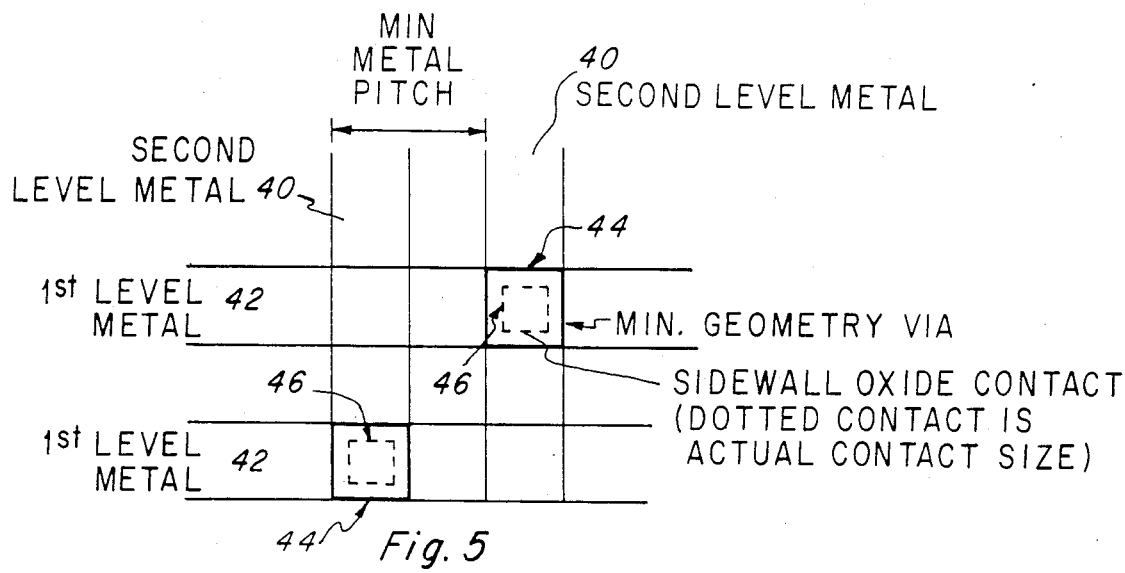
FIG. 5 shows a plan view of the application of the present invention to a double-level-metal structure.
Figure 6A:
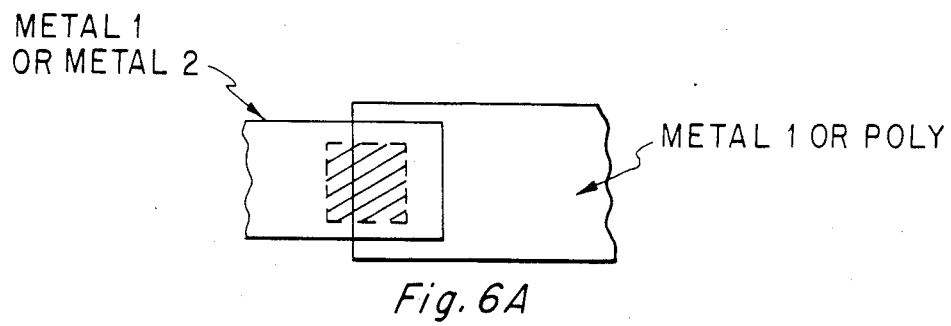
FIG. 6A shows a plan view of a sample via wherein the misalignment is sufficient that the as-patterned via hole overlaps the edge of the lower-lying conductor.
Figure 6B:
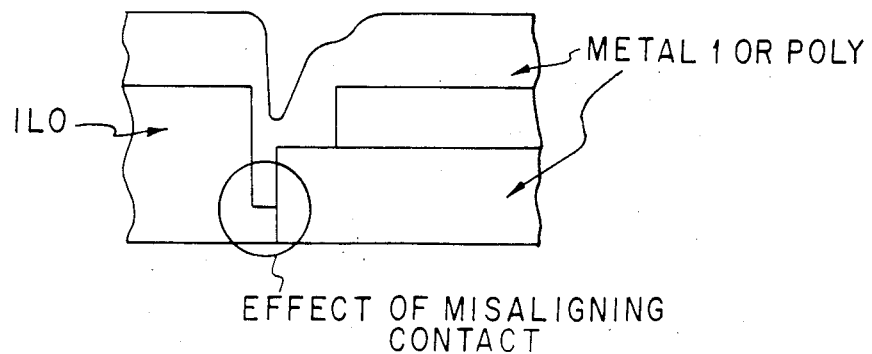
FIG. 6B shows the diastrous consequences of this misalignment in prior art processes.

A particular further advantage of the present invention is seen in multi-level processes, particularly in via intensive designs. For example, FIG. 5 shows a sample portion of a configuration where first level metal lines 42 are connected to a dense array of second level metal lines 40 by multiple vias. By using the present invention, the patterned via areas 44 (show as extra-heavy black outlines) are reduced to actual via areas 46 (shown as dotted lines), so that both first level metal lines 42 and second level metal lines 40 can be laid out as dense arrays. This is highly advantageous for gate arrays, as discussed above, and also for many other interconnect-intensive logic layouts, such as dedicated signal-processing parts or microprocessors generally.

A further advantage of the present invention is that it achieves the foregoing advantages without adding any significant processing complexity. That is, the only added steps are an LPCVD oxide deposition and anisotropic etch back to leave filaments. These steps are simple, inexpensive, and low-risk.

As the foregoing discussion indicates, the present invention is most particularly advantageous when combined with other advanced processing features at the true VLSI level. That is, the present invention is most advantageous in combination with advanced features such as low-sheet-resistance (silicided) source/drain regions, stud contacts, and minimum geometry metal pitch.

As will be obvious to those skilled in the art, the present invention can be widely modified and varied, and can be practiced in the context of a wide variety of processes. The scope of the present invention is therefore not limited except as set forth in the accompanying claims.

What is claimed is:

1. A process for fabricating integrated circuits, comprising the steps of:
    providing a substrate having semiconductor active device regions near the surface thereof;
    providing an insulating layer above predetermined portions of said active device regions;
    defining a first metal interconnect layer which interconnects predetermined portions of said active device regions to configure a predetermined circuit function;
    providing an interlevel dielectric above said first metal interconnect layer, and anisotropically etching said interlevel dielectric to expose said first metal interconnect layer at predetermined via locations;
    conformally depositing an additional layerof insulating material, and anisotropically etching said additional layer of insulating material to remove it from exposed flat surfaces, whereby said exposed via locations are narrowed at the periphery thereof by remaining portions of said additional layer of insulating material; and
    depositing, patterning, and etching an additional layer of conductive material, to interconnect said via areas in a predetermined pattern;
    wherein said first metal interconnect layer is defined to be no wider under at least some locations where said interlevel dielectric is etched than the minimum width of said first metal interconnect layer elsewhere.

2. The process of claim 1, wherein said interlevel dielectric has a top portion compositionally different from said additional layer of insulating material, and wherein said step of etching said additional layer of insulating material is controlled with respect to endpoint detection with respect to said compositionally different top portion of said interlevel dielectric.

3. The process of claim 1 wherein said additional layer of conductive material is defined to be no wider under at least some locations where said interlevel dielectric is etched than the minimum width of said second metal interconnect layer elsewhere.

4. The process of claim 1, wherein said step of depositing and additional layer of insulating material comprises low pressure chemical vapor deposition of silicon oxides.

5. The process of claim 1, wherein said step of depositing an additional layer of insulating material comprises low temperature plasma-assisted deposition of silicon oxides.

6. A process for fabricating integrated circuits, comprising the steps of:
    providing a substrate having semiconductor active device regions near the surface thereof, said device regions comprising field-effect transistors comprising gates defined in a layer of polycrystalline material comprising silicon;
    providing a first interlevel dielectric above said gate layer, patterning said first interlevel dielectric to expose predetermined contact locations in said gate layer and also predetermined contact locations in said active device regions, and defining a first metal interconnect layer which interconnects predetermined portions of said active device regions and of said gate layer to at least partially configure a predetermined circuit function;
    providing a second interlevel dielectric above said first metal interconnect layer, and anisotropically etching said second interlevel dielectric to expose said first metal interconnect layer at predetermined second via locations and also to expose said gate layer at other predetermined second via locations;
    conformally depositing an additional layer of insulating material, and anisotropically etching said additional layer of insulating material to remove it from exposed flat surfaces, whereby said exposed second via locations are narrowed at the periphery thereof by remaining portions of said additional layer of insulating material; and depositing, patterning, and etching an additional layer of conductive material, to interconnect said second via locations in a predetermined pattern;

wherein said additional layer of conductive material is defined to be no wider under at least some locations where said second interlevel dielectric is etched than the minimum width of said second metal interconnect layer elsewhere.

7. The process of claim 6, wherein said second interlevel dielectric has a top portion compositionally different from said additional layer of insulating material, and wherein said step of etching said additional layer of insulating material is controlled with respect to endpoint detection with respect to said compositionally different top portion of said second interlevel dielectric.

8. The process of claim 6, wherein said first metal interconnect layer is defined to be no wider under at least some locations where said second interlevel dielectric is etched than the minimum width of said first metal interconnect layer elsewhere.

* * * * *